United States Patent
Ott et al.

(10) Patent No.: US 9,553,153 B1
(45) Date of Patent: Jan. 24, 2017

(54) POST GROWTH DEFECT REDUCTION FOR HETEROEPITAXIAL MATERIALS

(71) Applicant: International Business Machines Corporation, Armonk, NY (US)

(72) Inventors: John A. Ott, Greenwood Lake, NY (US); Devendra K. Sadana, Pleasantville, NY (US); Brent A. Wacaser, Putnam Valley, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/957,088

(22) Filed: Dec. 2, 2015

(51) Int. Cl.
| | |
|---|---|
| *H01L 29/15* | (2006.01) |
| *H01L 29/32* | (2006.01) |
| *H01L 21/02* | (2006.01) |
| *H01L 21/306* | (2006.01) |
| *H01L 21/324* | (2006.01) |

(52) U.S. Cl.
CPC ........... *H01L 29/32* (2013.01); *H01L 21/0254* (2013.01); *H01L 21/02164* (2013.01); *H01L 21/02381* (2013.01); *H01L 21/02543* (2013.01); *H01L 21/02546* (2013.01); *H01L 21/30612* (2013.01); *H01L 21/3245* (2013.01)

(58) Field of Classification Search
CPC .................... H01L 2924/0002; H01L 2924/00; H01L 21/76832; H01L 29/6659; H01L 27/14627; H01L 27/14629; H01L 27/1464; H01L 29/7833; H01L 31/02327; H01L 31/0352; H01L 31/035227; H01L 21/76834; H01L 21/76
See application file for complete search history.

(56) References Cited

U.S. PATENT DOCUMENTS

| | | | |
|---|---|---|---|
| 5,084,409 A | 1/1992 | Beam, III et al. | |
| 5,997,638 A | 12/1999 | Copel et al. | |
| 7,919,381 B2 | 4/2011 | Nayfeh et al. | |
| 2008/0119007 A1* | 5/2008 | Raghuram et al. | H01L 27/2409 438/99 |

FOREIGN PATENT DOCUMENTS

| | | |
|---|---|---|
| EP | 0365875 B1 | 8/1995 |
| EP | 0407233 B1 | 3/1996 |
| WO | 2015002782 A1 | 1/2015 |

* cited by examiner

*Primary Examiner* — Robert Bachner
(74) *Attorney, Agent, or Firm* — Cantor Colburn LLP; Louis Percello

(57) ABSTRACT

A method of reducing defects in epitaxially grown III-V semiconductor material comprising: epitaxially growing a III-V semiconductor on a substrate; patterning and removing portions of the III-V semiconductor to form openings; depositing thermally stable material in the openings; depositing a capping layer over the semiconductor material and thermally stable material to form a substantially enclosed semiconductor; and annealing the substantially enclosed semiconductor.

15 Claims, 11 Drawing Sheets

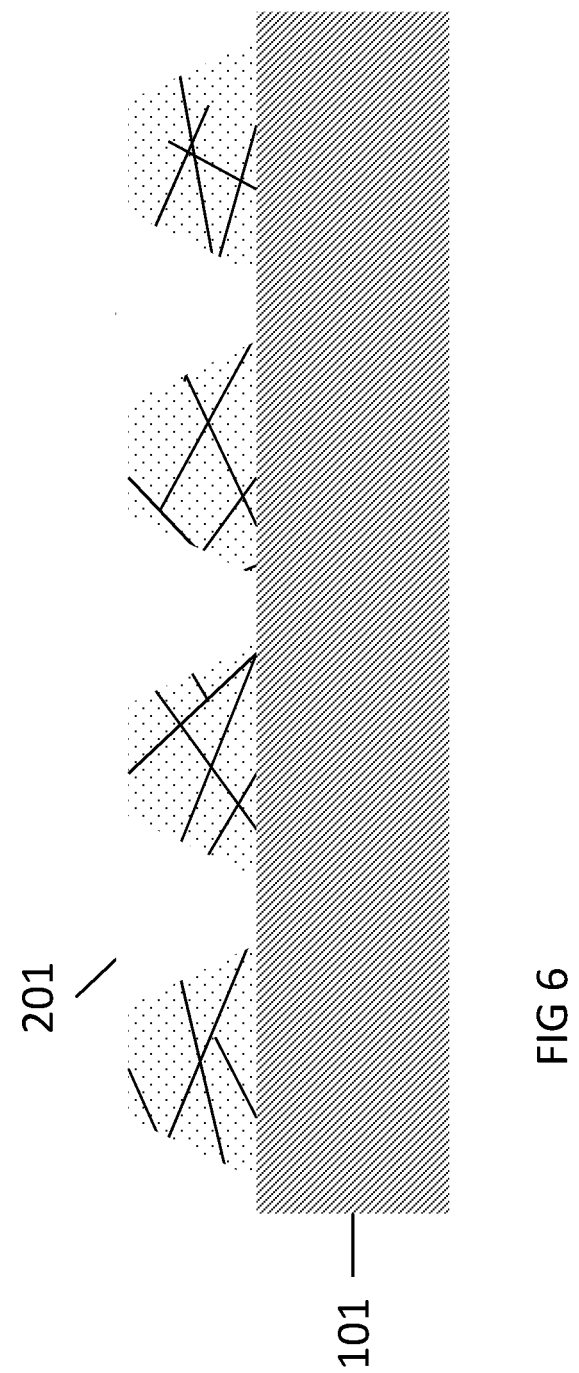

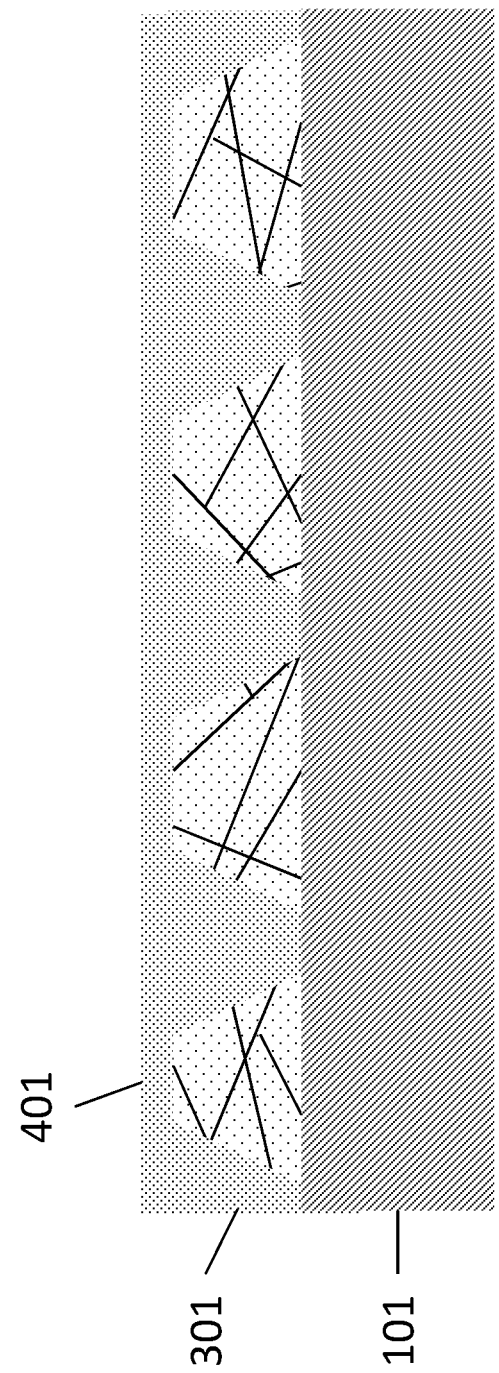

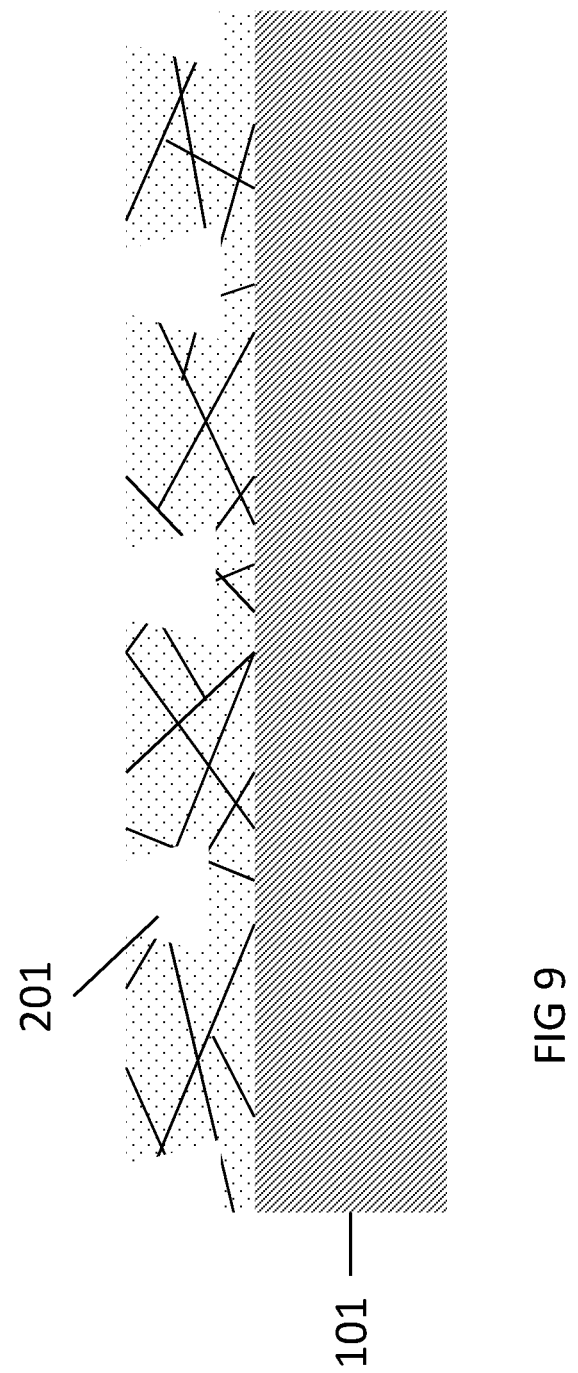

POST GROWTH DEFECT REDUCTION FOR HETEROEPITAXIAL MATERIALS

BACKGROUND

The present invention relates generally to semiconductor epitaxy and more specifically to a method for reducing defects within III-V semiconductor materials epitaxially grown on mismatched crystalline substrates.

For many III-V semiconductor material epitaxies, for example GaAs, annealing at temperatures higher than the growth temperature (i.e., temperatures above 550° C.) may be performed after epitaxial growth to annihilate defects and reduce overall defect densities. However, high temperature annealing may cause problems when one of the III-V materials used to form the epitaxial layer exhibits a high partial vapor pressure. For example, during high temperature annealing, Group V materials, which tend to have higher vapor pressures than Group III materials, may evaporate from the surface of the III-V semiconductor epitaxy, leaving droplets of Group III material behind. Such decomposition of the III-V semiconductor may lead to pitting of the III-V semiconductor, and subsequently, erosion of layers formed on top of the III-V semiconductor. These defects may degrade the performance of the III-V semiconductor device.

SUMMARY

A method of reducing defects in epitaxially grown III-V semiconductor material comprising:
  epitaxially growing a III-V semiconductor on a substrate;
  patterning and removing portions of the III-V semiconductor to form openings;
  depositing thermally stable material in the openings;
  depositing a capping layer over the semiconductor material and thermally stable material to form a substantially enclosed semiconductor; and
  annealing the substantially enclosed semiconductor.

In some embodiments a method of reducing defects in epitaxially grown III-V semiconductor material comprises:
  epitaxially growing a III-V semiconductor comprising indium phosphide, gallium arsenide, gallium nitride or a combination comprising one or more of the foregoing on a silicon substrate;
  patterning and removing portions of the III-V semiconductor to form openings;
  depositing thermally stable material comprising silicon oxide in the openings;
  depositing a capping layer comprising silicon oxide over the semiconductor material to form a substantially enclosed semiconductor; and
  annealing the substantially enclosed semiconductor at a temperature of 700 to 850° C. for a time of 1 to 10 minutes.

Also disclosed herein is a semiconductor structure comprising a blanket grown III-V semiconductor bounded by a substrate underneath, a thermally stable material on at least two sides and a capping layer above, wherein the capping layer at least partially overlaps with the thermally stable material.

BRIEF DESCRIPTION OF THE DRAWINGS

The following detailed description, given by way of example and not intended to limit the invention solely thereto, will best be appreciated in conjunction with the accompanying drawings, in which not all structures may be shown.

FIG. 6 shows a cross section of an epitaxially grown III-V semiconductor on a substrate after removal of portions of the semiconductor to form openings.

FIG. 7 shows a cross section of an epitaxially grown III-V semiconductor on a substrate having openings filled with a thermally stable material and capped with a capping layer.

FIG. 9 shows a cross section of an epitaxially grown III-V semiconductor on a substrate after removal of portions of the semiconductor to form openings.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
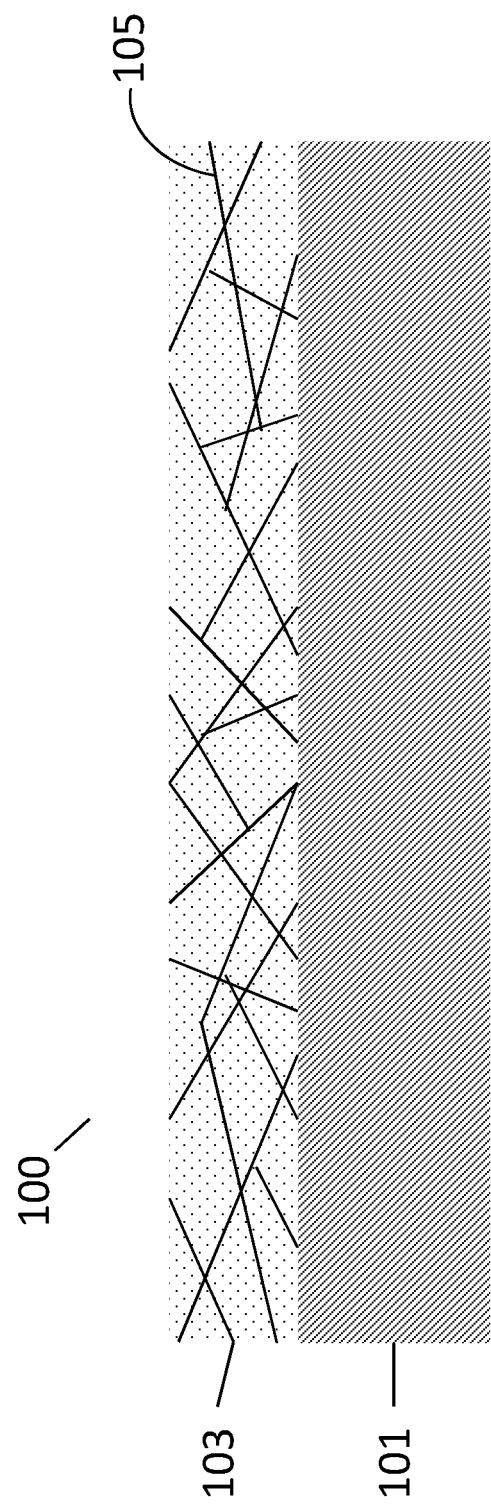
FIG. 1 is a representation of a cross section of an epitaxially grown III-V semiconductor on a substrate.

III-V semiconductor materials epitaxially grown on mismatched crystalline substrates typically have defects which can negatively affect the performance of the semiconductor device. One approach to reduce the defects is to anneal the semiconductor material at a temperature above the epitaxial growth temperature. Annealing at these temperatures annihilates a portion of the defects and reduces the overall defect density. The evaporation of the Group V material can be mitigated by providing an ambient of Group V material vapor within the annealing chamber during the annealing. However, as the temperature increases during the annealing process, so does the partial pressure of the Group V material above the III-V semiconductor. This may result in a practical upper annealing temperature limit even with ambient Group V material partial pressures supplied.

One way to overcome this drawback is to anneal a III-V semiconductor material which is substantially surrounded by a thermally stable material. The term "substantially surrounded" as used herein describes a III-V semiconductor material bounded by the substrate underneath, a thermally stable cap layer above and by a thermally stable material on at least two sides. It has been found that the order of events prior to annealing has an impact of the effectiveness of the annealing in reducing the number and location of defects. When the III-V material is grown in a constrained environment, i.e., bounded by a substrate underneath and a material on at least two sides, subsequent annealing while substantially surrounded is less effective than when the III-V semiconductor material is blanket-grown—grown as a layer with a substrate underneath but not bounded by a material on at least two sides—and annealed while substantially surrounded. The annealed, blanket-grown material has a lower defect density than the annealed, constrained growth material. Additionally, the annealed, blanket-grown semiconductor material has fewer defects located at or near the surface than the annealed, constrained growth semiconductor material.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

In the following description, numerous specific details are set forth, such as particular structures, components, materials, dimensions, processing steps, and techniques, in order to provide a thorough understanding of the present invention. However, it will be appreciated by one of ordinary skill of the art that the invention may be practiced without these specific details. In other instances, well-known structures or processing steps have not been described in detail in order to avoid obscuring the invention. It will be understood that when an element as a layer, region, or substrate is referred to as being "on" or "over" another element, it can be directly on the other element or intervening elements may also be present. In contrast, when an element is referred to as being "directly on" or "directly" over another element, there are no intervening elements present. It will also be understood that when an element is referred to as being "beneath," "below," or "under" another element, it can be directly beneath or under the other element, or intervening elements may be present. In contrast, when an element is referred to as being "directly beneath" or "directly under" another element, there are no intervening elements present.

As used herein, the term "III-V semiconductor" denotes a semiconductor material that includes at least one element from Group III of the Periodic Table of Elements (B, Al, Ga, In) and at least one element from Group V of the Periodic Table of Elements (N, P, As, Sb, Bi). Typically, the III-V semiconductors may be binary alloys, ternary alloys, or quaternary alloys, of III-V elements. Examples of III-V semiconductors that can be used in the present invention include, but are not limited to GaAs, InAs, InP, InGaAs, InAlAs, InAlAsP, AlInGaP, InGaAsP, GaN, InAlN, AlSb, InAlAsSb, and alloys thereof. As used herein, "epitaxy" refers to the deposition of a crystalline overlayer on a crystalline substrate, while "heteroepitaxy" refers specifically to epitaxy performed with materials that are different from each other. Heteroepitaxy implies that although the materials and crystal structures may not be identical, the crystal structures are related, with the substrate or underlying layer templating the crystal structure of the overlayer.

Referring now to FIG. 1, a starting point of the capped high temperature anneal process is shown. A preliminary structure 100 comprises an epitaxially grown III-V semiconductor 103 formed on a substrate 101. The III-V semiconductor 103 is blanket grown and has a thickness of 10 nanometers (nm) to 5 micrometers (μm). As used herein the term "blanket grown" is defined as describing being grown in a large area, namely an area greater than or equal to 1 square micrometer, or, greater than or equal to 1.5 square micrometers, or, greater than or equal to 2 square micrometers. Methods for epitaxial growth include metal organic chemical vapor deposition (MOCVD), metal organic vapor phase epitaxy (MOVPE), plasma enhanced CVD (PECVD), remote plasma enhanced CVD (RP-CVD), molecular beam epitaxy (MBE), hydride vapor phase epitaxy (HVPE), chloride vapor phase epitaxy (Cl-VPE), liquid phase epitaxy (LPE), and epitaxial lateral overgrowth (ELOG). The III-V semiconductor may consist of III-V semiconductor materials including, but not limited to, GaAs, InAs, InP, InGaAs, InAlAs, InAlAsP, AlInGaP, InGaAsP, GaN, InAlN, AlSb, InAlAsSb, and alloys thereof. In some embodiments, the III-V semiconductor may be a binary material, for e.g., GaAs. The III-V semiconductor may be doped, undoped or contain doped and undoped regions therein, and may have a single crystal orientation, or may have surface regions that have different crystal orientations. The III-V semiconductor may be strained, unstrained or a combination thereof. In some embodiments, a graded III-V semiconductor may be formed.

In some embodiments, the epitaxially grown III-V semiconductor may be of typical commercial quality, including defects 105 in the crystalline lattice. In some embodiments, the III-V semiconductor may consist of III-V material that crystallizes at a certain temperature, for example, of about 300 to 1100° C., forming a single or multi crystalline structure, as compared to the more amorphous structure. The defects 105 formed within the III-V semiconductor 103 may be spread throughout the epitaxy, including the upper regions.

The substrate 101 may be made of any semiconductor material typically known in the art, including, for example, silicon, germanium, silicon-germanium alloy, silicon carbide, silicon-germanium carbide alloy, and (e.g. II-VI) semiconductor materials. In some embodiments, the substrate 101 is a bulk substrate. In some embodiments, the substrate 101 is a semiconductor on insulator (SOI) substrate. In a particular embodiment, the substrate 101 is composed of silicon. It is also contemplated that the substrate may be composed of a crystalline insulator wafer like a single crystal quartz ($SiO_2$) or sapphire ($\alpha$-$Al_2O_3$).

Figure 2:
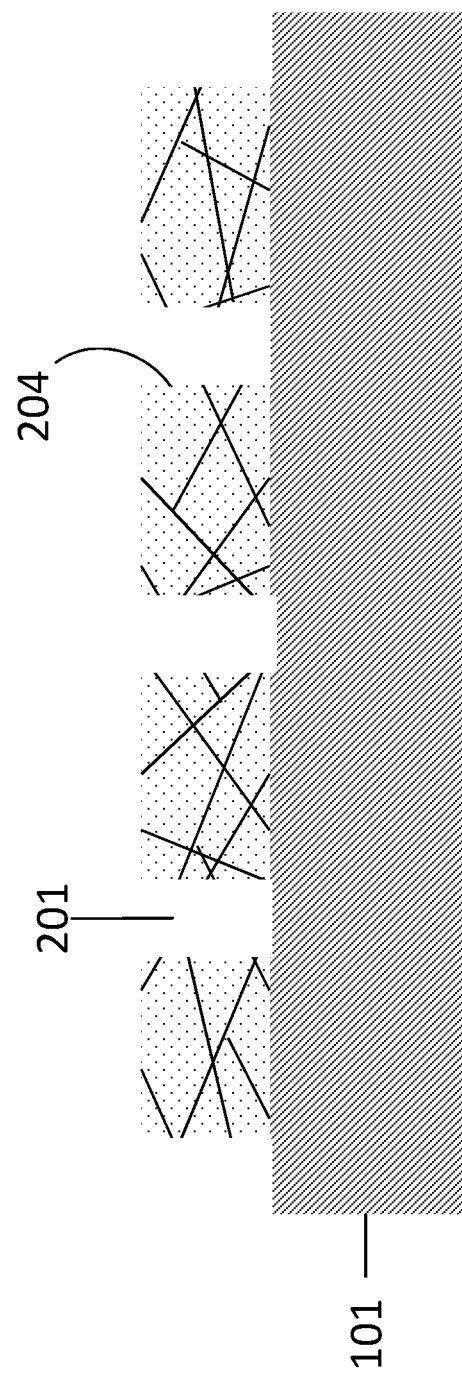
FIG. 2 shows a cross section of an epitaxially grown III-V semiconductor on a substrate after removal of portions of the semiconductor to form openings.
Figure 8:
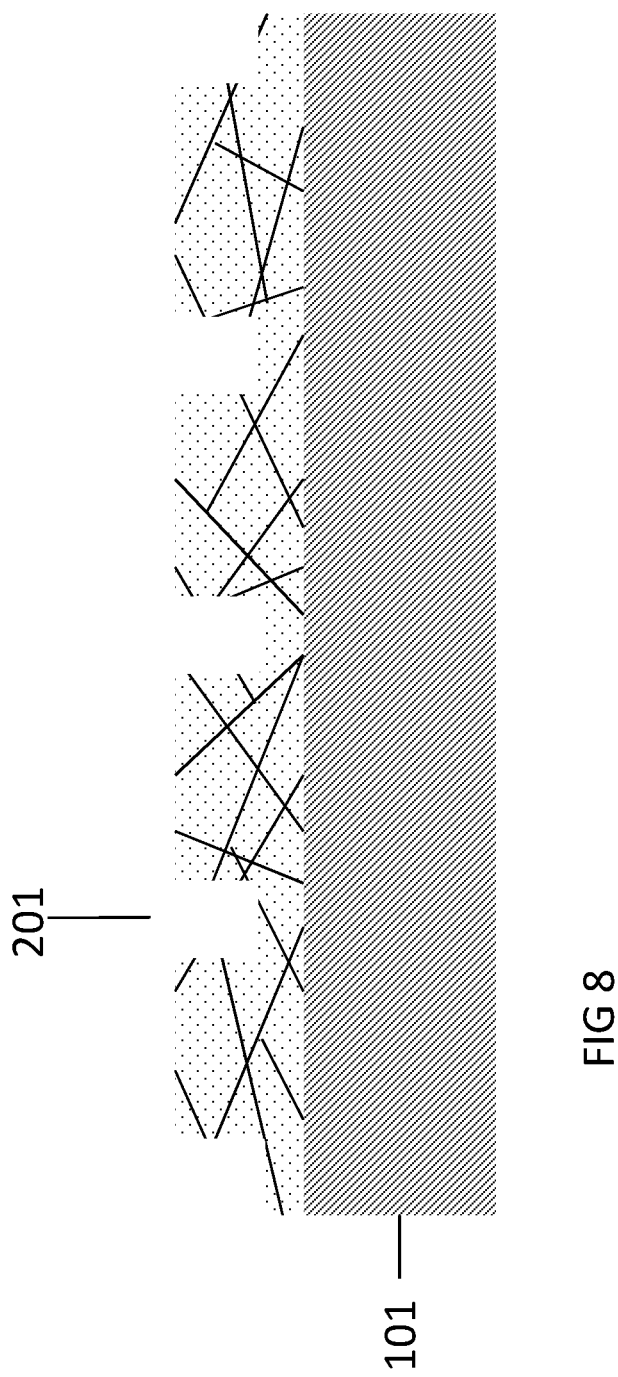
FIG. 8 shows a cross section of an epitaxially grown III-V semiconductor on a substrate after removal of portions of the semiconductor to form openings.

The III-V semiconductor 103 is patterned and unwanted material is removed. A photoresist material (not shown) may be formed on an upper surface of the III-V semiconductor. The photoresist material may then be patterned by a photolithography process to provide a photoresist pattern. After the photoresist material is patterned, a portion of the III-V semiconductor may be removed using a conventional etching process to form the openings. Alternatively the pattern can be formed by other conventional means like stencil lithography using a shadow mask or nanoimprint lithography. The etching process may be performed in one or more steps. The etching process may include a wet etching with reactive chemicals or dry etching process such as reactive ion etching (RIE), ion beam etching, or plasma etching. The patterned photoresist or other material may be removed or remain after the openings 201 are formed. The openings may expose an upper surface of the substrate 101 as shown in FIG. 2 or may only remove a portion of the III-V semiconductor 103 as shown in FIG. 8 and FIG. 9. The openings may be defined by vertical sidewalls of the III-V semiconductor 204 as shown in FIGS. 2 and 8 or have slanted walls as shown in FIG. 6 and FIG. 9. Without being bound by theory, it is believed that employing slanted walls may alter the expansion/contraction forces during annealing and may improve the reduction in defects. In some embodiments, the opening may have a width of 10 nanometers (nm) to 1000 nm.

Figure 3:
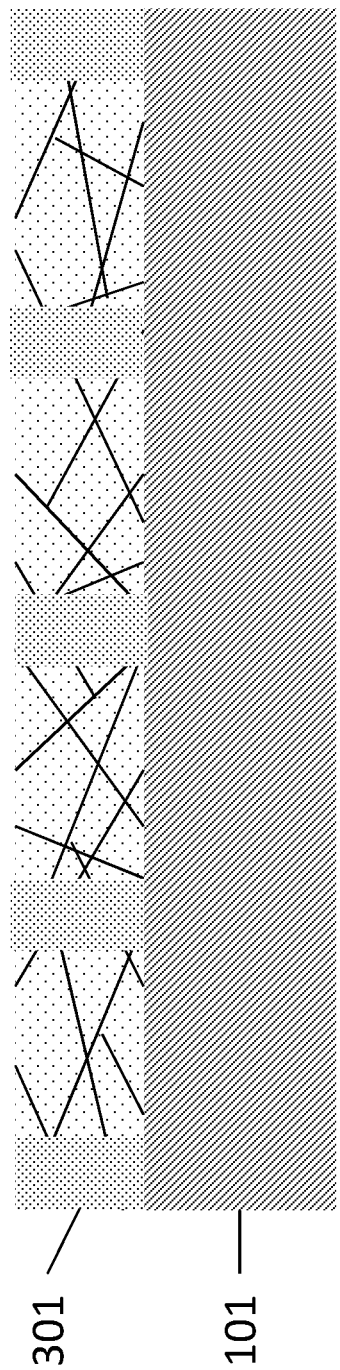
FIG. 3 shows a cross section of an epitaxially grown III-V semiconductor on a substrate having openings filled with a thermally stable material.

FIG. 3 and FIG. 7 shows thermally stable material 301 formed in the openings 201 and adjacent to the III-V semiconductor material. The thermally stable material can be formed using a conventional deposition technique, such as, for example, molecular beam epitaxy (MBE), chemical vapor deposition (CVD), plasma enhanced CVD (PECVD), atomic layer deposition (ALD), evaporation, physical vapor deposition (PVD), chemical solution deposition, and other like deposition processes. The thermally stable material 301 may be composed of a low-k dielectric material including, but not limited to, an oxide and/or silicates. A "low-k" material is a dielectric material with a lower dielectric constant relative to silicon dioxide ($SiO_2$), which is 3.9 (i.e., the ratio of the permittivity of $SiO_2$ divided by the permittivity of a vacuum). The thermally stable material 301 may be porous or non-porous. In some embodiments, the thermally stable material 301 is composed of an interlevel or intralevel dielectric material, including inorganic dielectrics and organic dielectrics. In some embodiments the thermally stable material is chosen to have a mismatched coefficient of thermal expansion (CTE) with the III-V semiconductor material. In some embodiments, the absolute value of the difference between the CTE of the III-V semiconductor and the CTE of the thermally stable material (the $\Delta$CTE) can be 1 to 6, or 2 to 5. In a particular embodiment the $\Delta$CTE is 4.1 or 2.4. In general the $\Delta$CTE should be as large as possible to encourage stress and strain during annealing. In some embodiments, the thermally stable material 301 is composed of silicon oxide.

Figure 4:
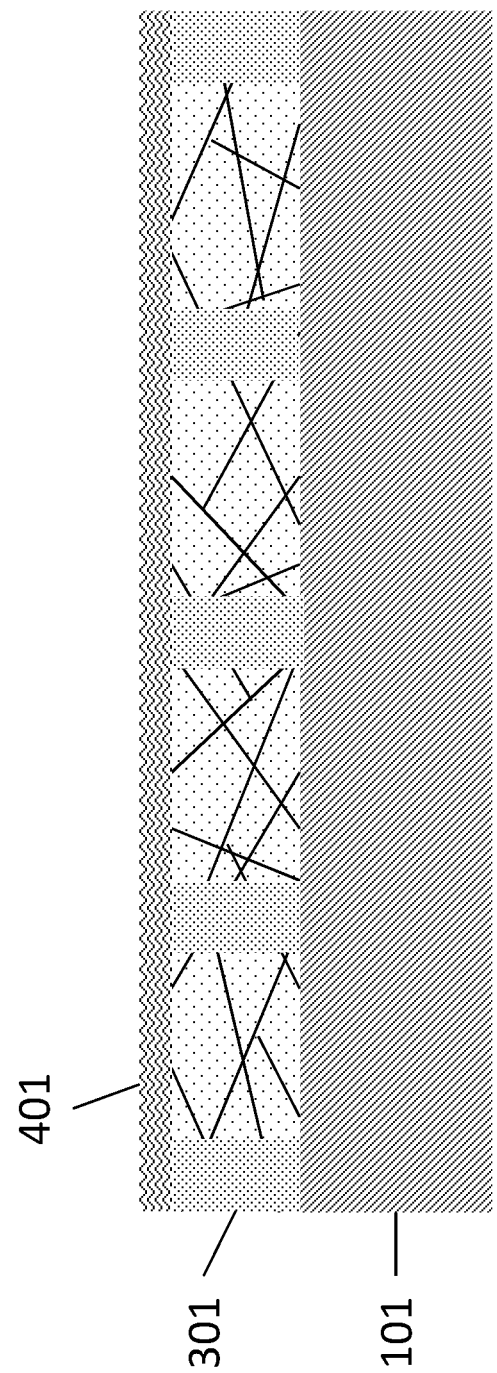
FIG. 4 shows a cross section of an epitaxially grown III-V semiconductor on a substrate having openings filled with a thermally stable material and capped with a capping layer.

Referring now to FIG. 4, a capping layer 401 is formed on the structure of FIG. 3. The capping layer comprises a thermally stable material as described above and may be the same as or different from the thermally stable material 301. In some embodiments the thermally stable material 301 and the capping layer 401 comprise the same material and are formed in a continuous manner. As discussed above with regard to the thermally stable material, in some embodiments the capping layer and the III-V semiconductor may also having a $\Delta$CTE 1 to 6 or 2 to 5. In a particular embodiment the $\Delta$CTE can be 4.1 or 2.4. In general the $\Delta$CTE should be as large as possible to encourage stress and strain during annealing. The capping layer 401 and the thermally stable material 301 can be chosen to engineer the expansion of these materials during annealing and manipulate the defect density and geographical distribution of defects after annealing. The capping layer 401 may consist of a thermally stable material and can act as a passivating layer for the III-V semiconductor 103. In some embodiments, the capping layer 401 may be composed of a material that is substantially similar to the material of the thermally stable material 301. In some embodiments, the capping layer 401 may be composed of silicon nitride, aluminum oxide, silicon oxide, or other similar materials. The capping layer 401 may also include carbon, hydrogen, or nitrogen atoms.

The capping layer 401 may be formed utilizing any conventional deposition process including, but not limited to, plasma enhanced chemical vapor deposition (PECVD), microwave enhanced chemical vapor deposition (MECVD), chemical vapor deposition (CVD), atomic layer deposition (ALD), e-beam evaporation, and sputtering.

In some embodiments, the capping layer 401 may be formed using a process gas that includes silicon-containing gas, such as for example, silane ($SiH_4$), disilane, dichlorosilane, trichlorosilane, and tetraethylorthosilane, methylsilane ($CH_3SiH_3$), dimethylsilane (($CH_3)_2SiH_2$), trimethylsilane (($CH_3)_3SiH$), diethylsilane (($C_2H_5)_2SiH_2$), propylsilane ($C_3H_8SiH_3$), vinyl methylsilane ($CH_2=CH)CH_3SiH_2$), 1,1,2,2-tetramethyl disilane ($HSi(CH_3)_2$—$Si(CH_3)_2H$), hexamethyl disilane (($CH_3)_3Si$—$Si(CH_3)_3$), 1,1,2,2,3,3-hexamethyl trisilane ($H(CH_3)_2Si$—$Si(CH_3)_2$—$SiH(CH_3)_2$), and 1,1,2,3,3-pentamethyl trisilane ($H(CH_3)_2Si$—$SiH(CH_3)$—$SiH(CH_3)_2$). The process gas may also include an oxygen-containing gas, such as oxygen ($O_2$), nitrous oxide ($N_2O$), ozone ($O_3$), and carbon dioxide ($CO_2$). In a particular embodiment, the thermally stable material 301 and the capping layer 401 can be deposited by a more or less conformal coating of the surfaces by plasma enhanced CVD with non-stoichiometric silicon oxide ($SiO_x$).

The thickness of the capping layer 401 may vary depending on the deposition technique employed. In some embodiments, the capping layer 401 may have a thickness $T_{401}$ of 1 nm to 500 nm. The capping layer 401 covering the upper surface of the III-V semiconductor 103 is effective as a capping/passivating layer that, along with the thermally stable material 301, protects the III-V semiconductor 103 during a high temperature anneal.

The structure of FIG. 4 or FIG. 7 is subjected to an annealing processes, such as, for example, rapid thermal annealing (RTA), flash lamp annealing, furnace annealing, laser annealing, and combinations comprising one or more of the foregoing. In some embodiments, the annealing process may include multiple steps. During the annealing process, the structure of FIG. 4 is heated to a temperature of 500° C. to 2000° C., or a temperature of 600° C. to 850°. In some embodiments, the annealing process is carried out for a time period of 1 second to 600 seconds. The capping layer 401 and the thermally stable material 301 prevents or limits the evaporation of the Group V material from the III-V semiconductor 103 during the annealing process. This may reduce the number of defects 105 in the III-V semiconductor 103 by allowing the high temperature anneal to mobilize and annihilate the defects 105 without the evaporation of Group V material.

In some embodiments the structure is annealed by subjecting it to multiple heating and cooling cycles. The heating and cooling cycles can heat to the same elevated temperature or the elevated temperature can be varied by cycle. Similarly the cooling target temperature can be the same or varied by cycle. An exemplary annealing process comprises heating from room temperature to 750° C., then cooling to 400° C., and repeating the heating (to 700° C.) and cooling (to 400° C.) cycle for the desired number of cycles. The number of cycles can be 3 to 7, or 4 to 6. After completion of the cycling the structure is cooled to room temperature.

The annealing process can be performed in a pressurized atmosphere of gaseous Group V material corresponding to the Group V material that is present in the III-V semiconductor 103. The combination of the capping layer 401, the thermally stable material 301, and the pressurized Group V material atmosphere may not only prevent the Group V material from evaporating out of the III-V semiconductor 103, but may even result in the atmospheric Group V material diffusing into the III-V semiconductor 103. This may reduce the number as well as the magnitude of defects 105 in the III-V semiconductor 103.

In an exemplary embodiment where the III-V semiconductor 103 is composed of GaAs, an arsenic or arsine atmosphere (with a partial pressure of about $10^{-3}$ torr) may be maintained. Without the capping layer 401, the highest temperature that could be used for in situ annealing under the same arsenic atmosphere (about $10^{-3}$ torr), is approximately 700° C. This practical limit is approximately 50° C. above the congruent temperature for GaAs sublimation (i.e., the temperature at which the vapor pressures of the gallium and arsenic are equal). However, because the capping layer 401 and the thermally stable material 301 prevents or limits evaporation and migration of the As out of the III-V semiconductor 103, the annealing temperature may be raised well above 700° C. without causing surface faceting or decomposition of the III-V semiconductor 103. In some embodiments, the annealing process, when performed in conjunction with the capping layer, thermally stable material and atmospheric As, may be performed at temperatures of approximately 800° C. or higher.

The capping layer 401 and the thermally stable material 301 may prevent or limit the evaporation and movement of Group V atoms out of the III-V semiconductor 103 during high temperature annealing. In addition, the capping layer 401 and the thermally stable material 301 may contain the III-V semiconductor 103 material and help increase the Group V element's partial pressure within the III-V semiconductor 103. During high temperature annealing, the mismatch in thermal expansion between the Group III and Group V elements within the III-V semiconductor 103 may increase strain and stress within the III-V semiconductor 103. Containing the III-V semiconductor 103 within the capping layer 401 and the thermally stable material 301 may prevent the relief of this strain and stress through faceting or by expansion upward, as in conventional techniques. As a result, the potential energy of the stress and strain may rearrange and cure the crystalline structure within the III-V semiconductor 103, and reduce the number as well as the magnitude of defects 105.

Figure 5A:
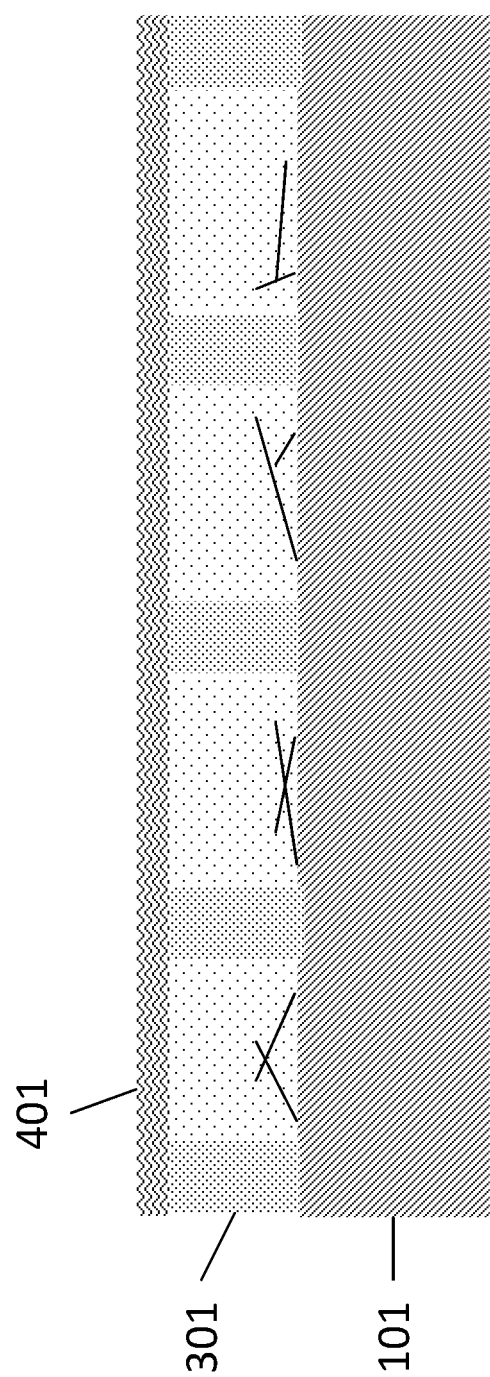
FIG. 5a shows a cross section of an epitaxially grown III-V semiconductor on a substrate after annealing.
Figure 5B:
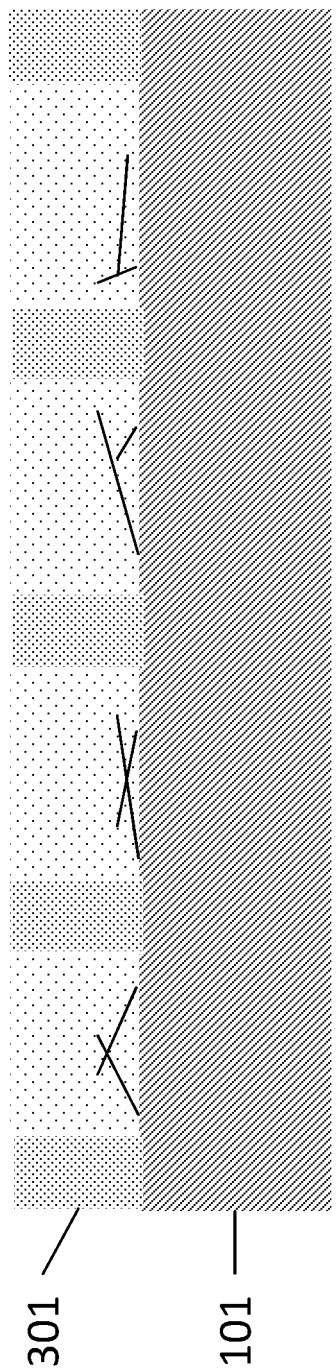
FIG. 5b shows a cross section of an epitaxially grown III-V semiconductor on a substrate after annealing and removal of the capping layer.
Figure 5C:
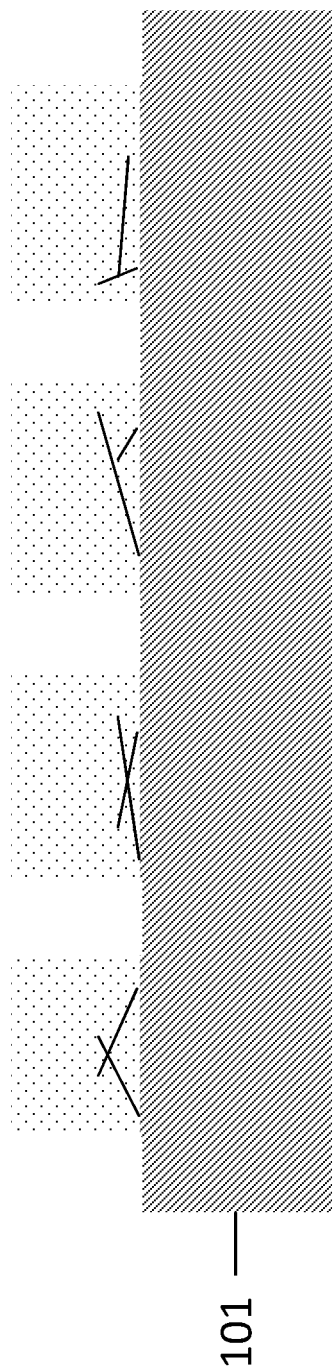
FIG. 5c shows a cross section of an epitaxially grown III-V semiconductor on a substrate after annealing and after removal of the capping layer and thermally stable material.

Referring now to FIGS. 5a-c, cross section views illustrating the structure after annealing are shown. FIG. 5a shows the structure after annealing with the capping layer 401 and thermally stable material 301 in place. FIG. 5b shows the structure after annealing with the capping layer 401 removed and thermally stable material 301 in place. It is contemplated that only a portion the capping layer can be removed although this is not shown in FIG. 5b. FIG. 5c is a cross section illustrating the structure after annealing with both the capping layer 401 and the thermally stable material 301 removed. The capping layer 401 and the thermally stable material 301 may be removed through a conventional etching process, such as, for example, a wet etch or a stripping process. In some embodiments, the capping layer 401 may be fully or partially removed using a conventional planarization process, such as, for example, chemical mechanical planarization (CMP) and the thermally stable material removed by etching. It is also contemplated that the capping layer, thermally stable material or both may be left in place. After annealing, the III-V semiconductor 103 may be further processed. For example, a gate conductor (not shown) may be formed on the upper surface of the III-V semiconductor 103 by a deposition process such as, for example, CVD, PECVD, PVD, plating, thermal or ebeam evaporation and sputtering.

Embodiments of the current invention reduce defects present within a III-V semiconductor by surrounding the blanket grown III-V semiconductor with thermally stable material during a high temperature annealing process. The curing and rearrangement of the crystalline lattice structure of the III-V semiconductor that may result from the capped annealing may help reduce surface faceting and surface decomposition. This may improve the III-V semiconductor material's dielectric properties. The capped annealing process may also render the surface of the III-V semiconductor material in excellent condition for further processing, such as re-growth, without requiring additional preparation requirements.

In some embodiments a method of reducing defects in epitaxially grown III-V semiconductor material comprises epitaxially growing a III-V semiconductor comprising indium phosphide on a silicon substrate. The blanket grown III-V semiconductor is patterned and portions removed to form openings which expose portions of the substrate. Thermally stable material comprising $SiO_x$ is deposited conformally in the openings and on the top surface of the III-V semiconductor to form the capping layer, substantially enclosing the semiconductor. The substantially enclosed semiconductor is annealed at a temperature of 700° C. to 850° C. for a time of 1 to 10 minutes. Annealing can be performed in a pressurized atmosphere of gaseous Group V material corresponding to the Group V material that is present in the III-V semiconductor. The capping layer has a thickness of 10 to 400 nanometers. The openings have a width of 5 nm to 1000 nm. The III-V semiconductor has a thickness of 20 to 1000 nm. The annealed semiconductor has a defect density less than or equal to 1% of the defect density of the semiconductor prior to annealing.

The terminology used herein is for the purpose of describing particular embodiments only and is not intended to be limiting of the invention. As used herein, the singular forms "a," "an," and "the" are intended to include the plural forms as well, unless the context clearly indicates otherwise. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method of reducing defects in epitaxially grown III-V semiconductor material comprising:
    epitaxially growing a III-V semiconductor on a substrate;
    patterning and removing portions of the III-V semiconductor to form openings;
    depositing thermally stable material in the openings;
    depositing a capping layer over the semiconductor material and thermally stable material to form a substantially enclosed semiconductor; and
    annealing the substantially enclosed semiconductor;
    wherein annealing comprises a heating and cooling cycle wherein the heating is to a temperature of 500 to 2000° C. for a time of 1 to 600 seconds and cooling is to a lower temperature of 200 to 500° C.

2. The method of claim 1, wherein the thermally stable material and the capping layer both comprise the same material.

3. The method of claim 1 wherein the III-V semiconductor and the thermally stable material have a $\Delta$CTE of 1 to 6.

4. The method of claim 1 wherein the III-V semiconductor and the capping layer have a $\Delta$CTE of 1 to 6.

5. The method of claim 1, wherein the capping layer and the thermally stable material comprise the different materials.

6. The method of claim 1, wherein annealing comprises 2 to 5 heating and cooling cycles.

7. The method of claim 1, wherein annealing is performed in a pressurized atmosphere of gaseous Group V material corresponding to the Group V material that is present in the III-V semiconductor.

8. The method of claim 1, wherein the annealed semiconductor has a defect density less than or equal to 1% of the defect density of the semiconductor prior to annealing.

9. The method of claim 1, wherein the openings expose a portion of the substrate.

10. A method of reducing defects in epitaxially grown III-V semiconductor material comprising:
    epitaxially growing a III-V semiconductor comprising indium phosphide, gallium arsenide, gallium nitride or a combination comprising one or more of the foregoing on a silicon substrate;
    patterning and removing portions of the III-V semiconductor to form openings which expose portions of the substrate;
    depositing thermally stable material comprising SiOx in the openings;
    depositing a capping layer comprising SiOx over the semiconductor material and thermally stable material to form a substantially enclosed semiconductor; and
    annealing the substantially enclosed semiconductor at a temperature of 700° C. to 850° C. for a time of 1 minute to 10 minutes.

11. The method of claim 10, wherein annealing further comprises cycling between a temperature of 200 to 500° C. and a temperature of 700° C. to 850° C.

12. The method of claim 10, wherein annealing is performed in a pressurized atmosphere of gaseous Group V material corresponding to the Group V material that is present in the III-V semiconductor.

13. The method of claim 10, wherein the III-V semiconductor has a thickness of 10 nanometers to 5 micrometers.

14. The method of claim 10, wherein the annealed semiconductor has a defect density less than or equal to 1% of the defect density of the semiconductor prior to annealing.

15. The method of claim 10, wherein the openings expose a portion of the substrate.

\* \* \* \* \*